United States Patent
Chung et al.

(10) Patent No.: US 8,247,745 B2
(45) Date of Patent: Aug. 21, 2012

(54) TEMPERATURE SENSOR FOR A FOOD HOLDING CABINET

(75) Inventors: Terry Tae-Il Chung, Bartlett, IL (US); Jeff Schroeder, Lake Zurich, IL (US); Kerry Berland, Chicago, IL (US); Douglas Reinking, Chicago, IL (US)

(73) Assignee: Prince Castle, LLC., Carol Stream, IL (US)

( * ) Notice: Subject to any disclaimer, the term of this patent is extended or adjusted under 35 U.S.C. 154(b) by 264 days.

(21) Appl. No.: 12/759,760

(22) Filed: Apr. 14, 2010

(65) Prior Publication Data
US 2011/0252984 A1 Oct. 20, 2011

(51) Int. Cl.
*H05B 1/02* (2006.01)
(52) U.S. Cl. .................................................. 219/494
(58) Field of Classification Search .................. 219/494
See application file for complete search history.

(56) References Cited

U.S. PATENT DOCUMENTS
2008/0213449 A1* 9/2008 Wisner et al. ................. 426/520

OTHER PUBLICATIONS

Semiconductor Components Industries, LLC; ADT7461 specification, +/− C. Temperature Monitor with Series Resistance Cancellation; Jan. 2009.

* cited by examiner

*Primary Examiner* — Hoai V Ho
(74) *Attorney, Agent, or Firm* — Kelly & Krause, LP; Joseph P. Krause

(57) ABSTRACT

The temperature of shelves used in a food holding cabinet are measured using a transistor. The voltage across a PN junction being known to be temperature dependent, the shelf temperature can be inferred from a calculated temperature of a PN junction of a transistor thermally coupled to a heated or refrigerated shelf. No calibration of the measurement device is required since the PN junction voltage, current and temperature relationship is well known.

8 Claims, 11 Drawing Sheets

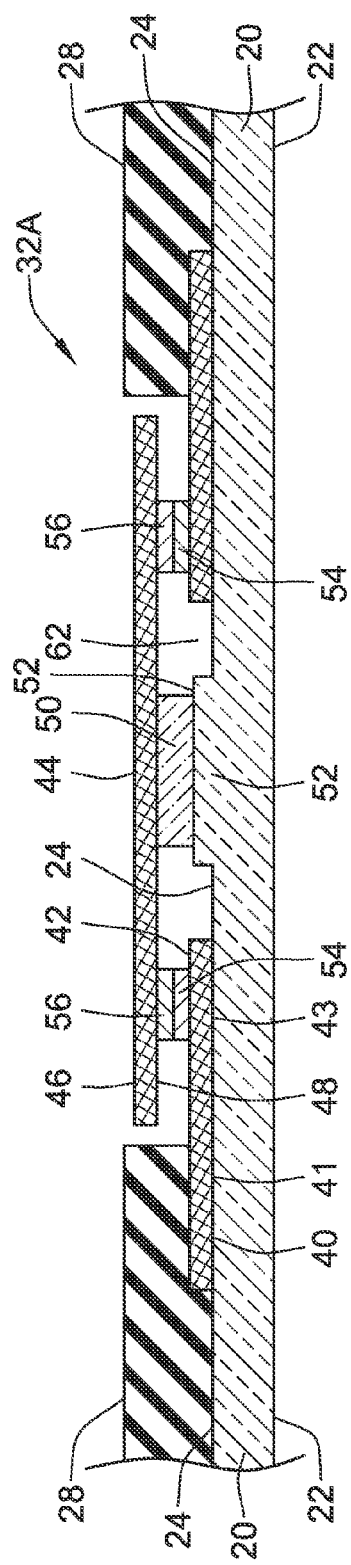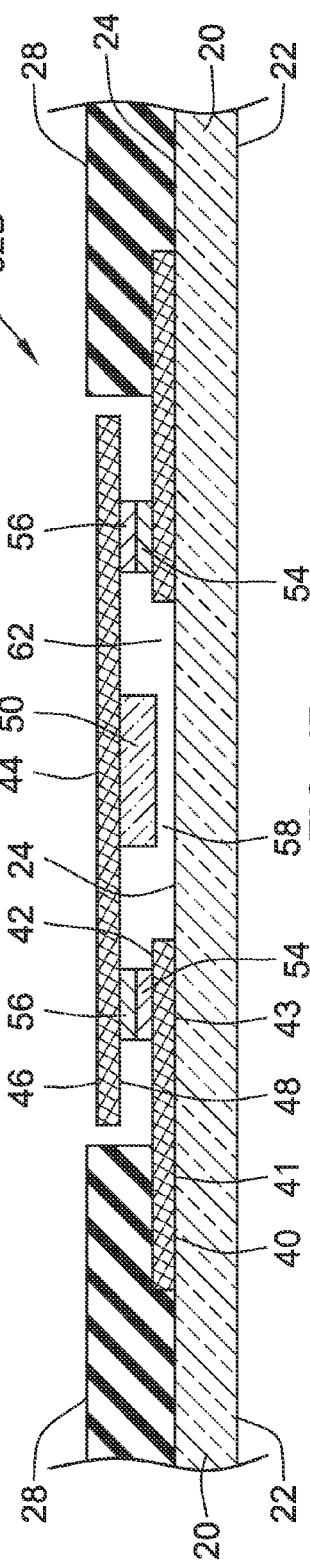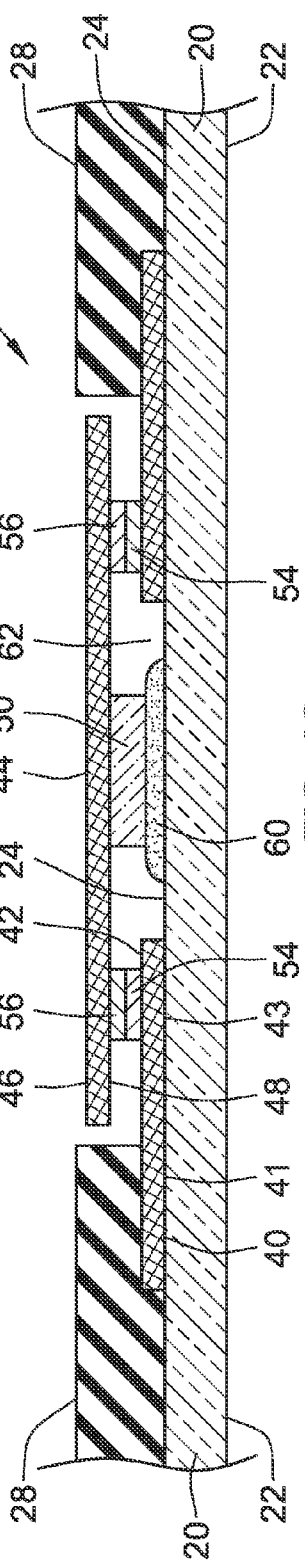

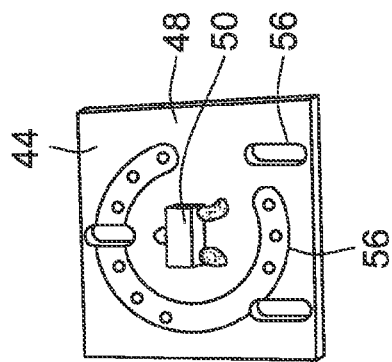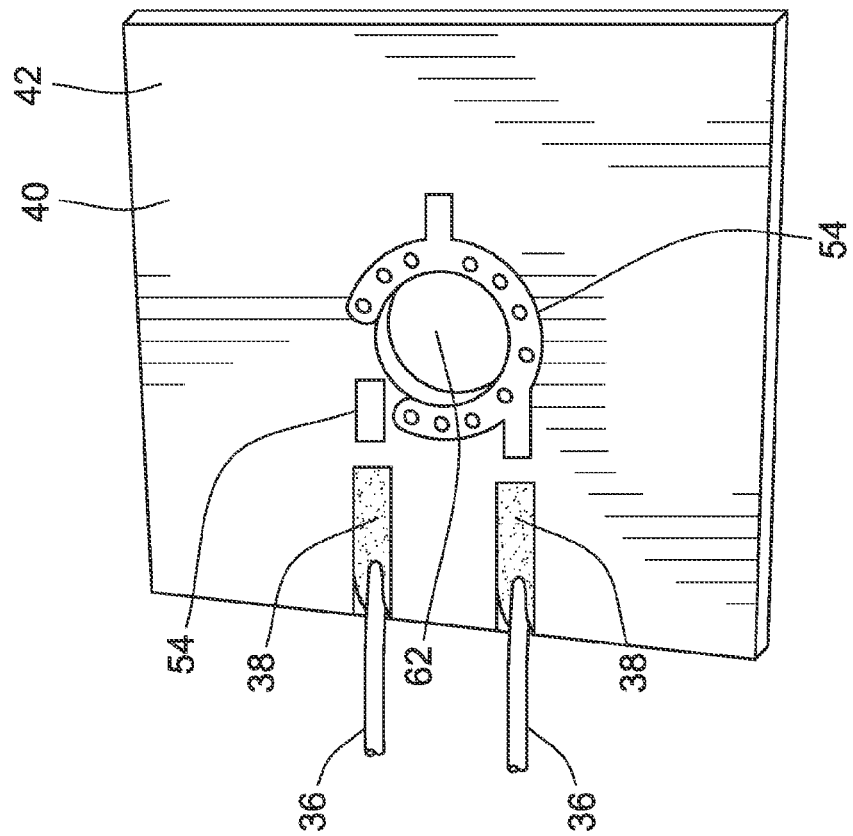
FIG. 7

TEMPERATURE SENSOR FOR A FOOD HOLDING CABINET

BACKGROUND

Food holding cabinets are used in restaurants and food services to maintain or regulate the temperature of a prepared food product until it is ready for sale or consumption. Some food holding cabinets use a thermocouple to sense the temperature of the cabinet interior or the temperature of a shelf or other interior surface. Other holding cabinets use a temperature-sensitive resistor to sense temperature within a food holding cabinet.

One problem with prior art temperature-sensitive resistances and thermocouples is that when they are used to measure temperature, the circuitry that measures a voltage or resistance requires calibration. Since each thermocouple and each temperature-sensitive resistor will have somewhat unique or different characteristics, circuitry that measures a voltage from a thermocouple or the resistance of a temperature-sensitive resistance needs to be calibrated to each device.

Those of ordinary skill in the electronic arts know that semiconductor P-N junctions have a well-known relationship between the junction voltage and the junction's temperature. A semiconductor can therefore be used to sense or measure temperature if it is properly coupled to interface circuitry. Since the relationship between junction voltage and junction temperature is well known, a semiconductor temperature sensor can avoid the need for calibration required by various prior art sensors.

Since most food holding cabinets (holding cabinets) keep food warm by heating a shelf or other surface in the holding cabinet, it is preferable for a semiconductor temperature sensor to be thermally coupled to the heated shelf or other surface. A method and apparatus for measuring temperature in a food holding cabinet using a semiconductor would be an improvement over the prior art.

BRIEF DESCRIPTION OF THE DRAWINGS

FIGS. 4A, 4B and 4C are cross-sectional views showing a temperature sensor and its thermal coupling to a shelf of a food holding cabinet, such as the one shown in FIG. 1;

FIG. 7 depicts the top side of a second circuit board on which a temperature-sensing transistor is mounted, prior to its attachment to the top side of a first circuit board;

DETAILED DESCRIPTION

Figure 1:
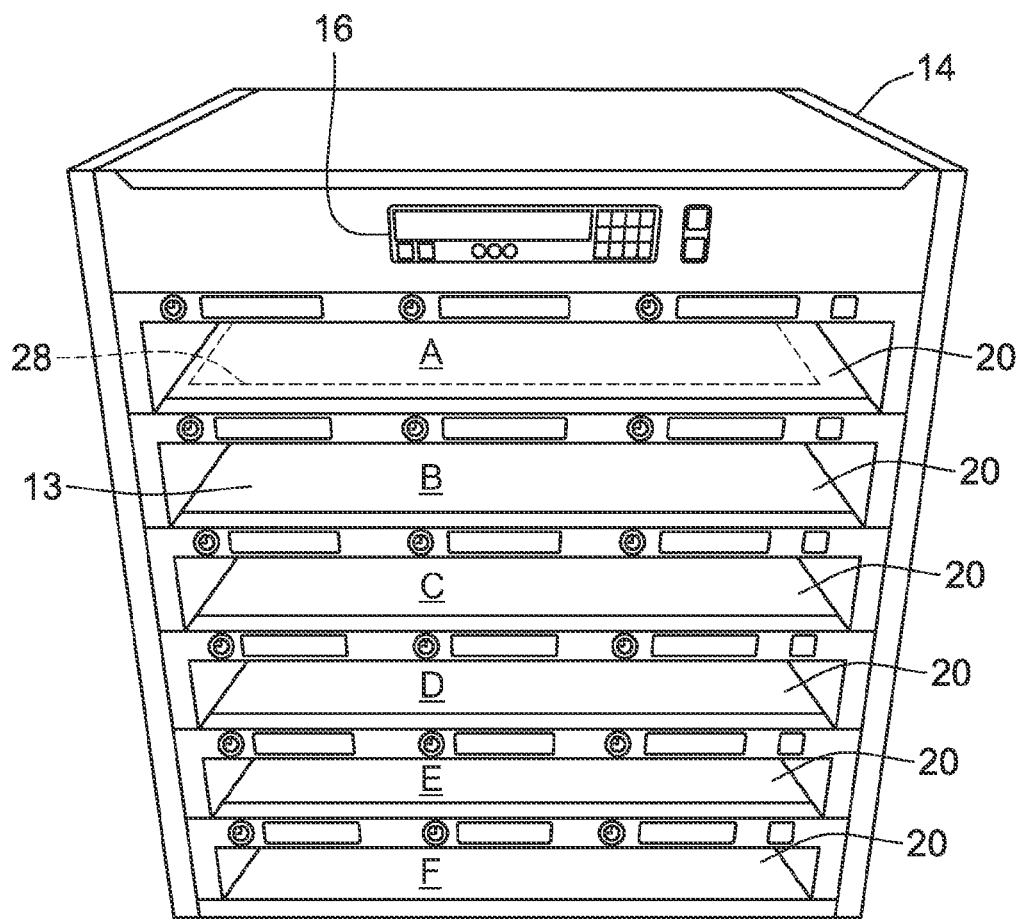
FIG. 1 is a perspective view of a food holding cabinet.

FIG. 1 is a perspective view of a temperature-controlled food holding cabinet 10. The cabinet 10 is comprised of a chassis or frame, exterior panels as shown, and one or more horizontal shelves 20, which are made of a thermally conductive material such as aluminum or copper. The shelves and cabinet sidewalls define six separate food holding compartments identified by letters A-F, the temperatures of which are controlled to preserve freshness of a food product stored therein.

In one embodiment, the shelves 20 are electrically heated. In another embodiment, the shelves are cooled.

In the heated-shelf embodiment, input heat energy is closely controlled to keep food products that sit atop the shelves 20 and within a corresponding compartment, at an optimum holding temperature for each food product. A preferred holding temperature or temperature range for a food product is typically specified by a food service operator, a restaurant owner or a manufacturer of a food item.

In the heated-shelf embodiments disclosed herein, shelf temperatures are controlled by measuring the shelf temperature and, in response thereto, adjusting electric energy provided to one or more electrically-resistive wires, not visible in FIG. 1, but which are mechanically attached to at least one side of a shelf 20. In refrigerated-shelf embodiments, shelf temperatures are maintained the same way, i.e., electric energy to a refrigeration device or heat sinking Peltier device is controlled in response to a measured temperature.

Shelf temperature is measured by one or more semiconductor temperature sensors not visible in FIG. 1 because they are attached to the lower or underside of the shelves 20. A temperature-sensing semiconductor that measures temperatures is in close proximity to the shelf 20 such that the semiconductor sensor is considered herein to be thermally coupled to the shelves 20.

In a first embodiment of a temperature sensor comprised of two separate circuit boards, a semiconductor temperature sensing element is mounted to a first circuit board, which is mounted "upside down" to a second circuit board having a through hole. The second circuit board with the hole is attached to a shelf by an adhesion layer that is vulcanized to the shelf in a high-temperature heating process. After the vulcanization is accomplished, the first circuit board is attached to the second circuit board in such a way that the semiconductor on the first circuit board fits within the hole of the second circuit board and just off the surface of the shelf.

In a second embodiment, which is a variant of the first embodiment, the circuit boards' thicknesses are configured such that the temperatures-sensing semiconductor case makes a direct thermal contact.

In a third embodiment, which is also a variant of the first embodiment, the semiconductor temperature sensing element fits with the hole in the second circuit board, however, an electrically-insulating, heat-conductive silicon grease is added to the hole in the second circuit board. The heat-conductive grease improves heat transfer between the semiconductor and shelf.

In a fourth and preferred embodiment, the temperature sensing element is mounted to the top side of a small circuit board. The back side of the circuit board is plated or otherwise covered with a thermally-conductive metal plate, preferably made of copper. The circuit board is attached directly to the shelf surface using a double-sided, heat-conductive tape, or an equivalent, heat-transmissive adhesive, which is applied to the thermally-conductive, back-side plate. The heat-conductive double-sided tape effectively attaches the circuit board to the shelf and provides a heat transmissive coupling.

A "via" is a hole through a circuit board, which is filled or at least lined with a conductive material. Before the circuit board is attached, a thermally-conductive via is formed in the circuit board that extends from the back side metal plate to the circuit board's top side. The thermally-conductive via terminates on the top side with the top end of the via co-planar or substantially co-planar with the top side.

A temperature-sensing semiconductor is mounted on the top side of the circuit board, straddling the top of the via. The temperature-sensing semiconductor is preferably embodied as a PNP or NPN, bi-polar transistor wired to provide a PN junction, the forward biased voltage of which is directly related to the PN junction temperature and calculable.

Heat energy from the shelf is conducted through the tape, through the plate and into the via. The via conducts the heat upwardly to the underside of the semiconductor. The PN junction temperature can be calculated from the voltage across the junction. The temperature measurement or determination therefore does not require any sort of calibration to be performed before or after the sensor's installation on a device to be monitored.

In a fifth embodiment, the circuit board of the fourth embodiment is formed to have several thermally-conductive vias that extend between the metal plate on the back side of the circuit board to the top side. The multiple vias are located around where the temperature-sensing semiconductor is attached to the top side of the circuit board. Heat energy from the shelf is conducted through the tape, through the plate and into the several vias. The vias, which surround a temperature-sensing semiconductor on the top side of the circuit board, provide heat energy to the semiconductor. As with the fourth embodiment, the temperature of the PN junction can be determined from the PN junction voltage without having to calibrate the device or measurement.

In each embodiment, the semiconductor temperature sensors are electrically connected to a computer not shown per se, however, a control panel for the computer is identified in the figures by reference numeral 16. For the sake of simplicity and brevity, reference numeral 16 hereafter refers to both the control panel shown as well as a software-controlled computer or other hardware device, which senses or measures signals from a semiconductor temperature sensor and adjusts the electrical energy provided to the resistive heating elements to effectuate temperature control. In embodiments where the cabinet is refrigerated, the computer 16 controls one or more refrigeration/cooling devices to maintain shelf temperature accordingly.

Figure 2:
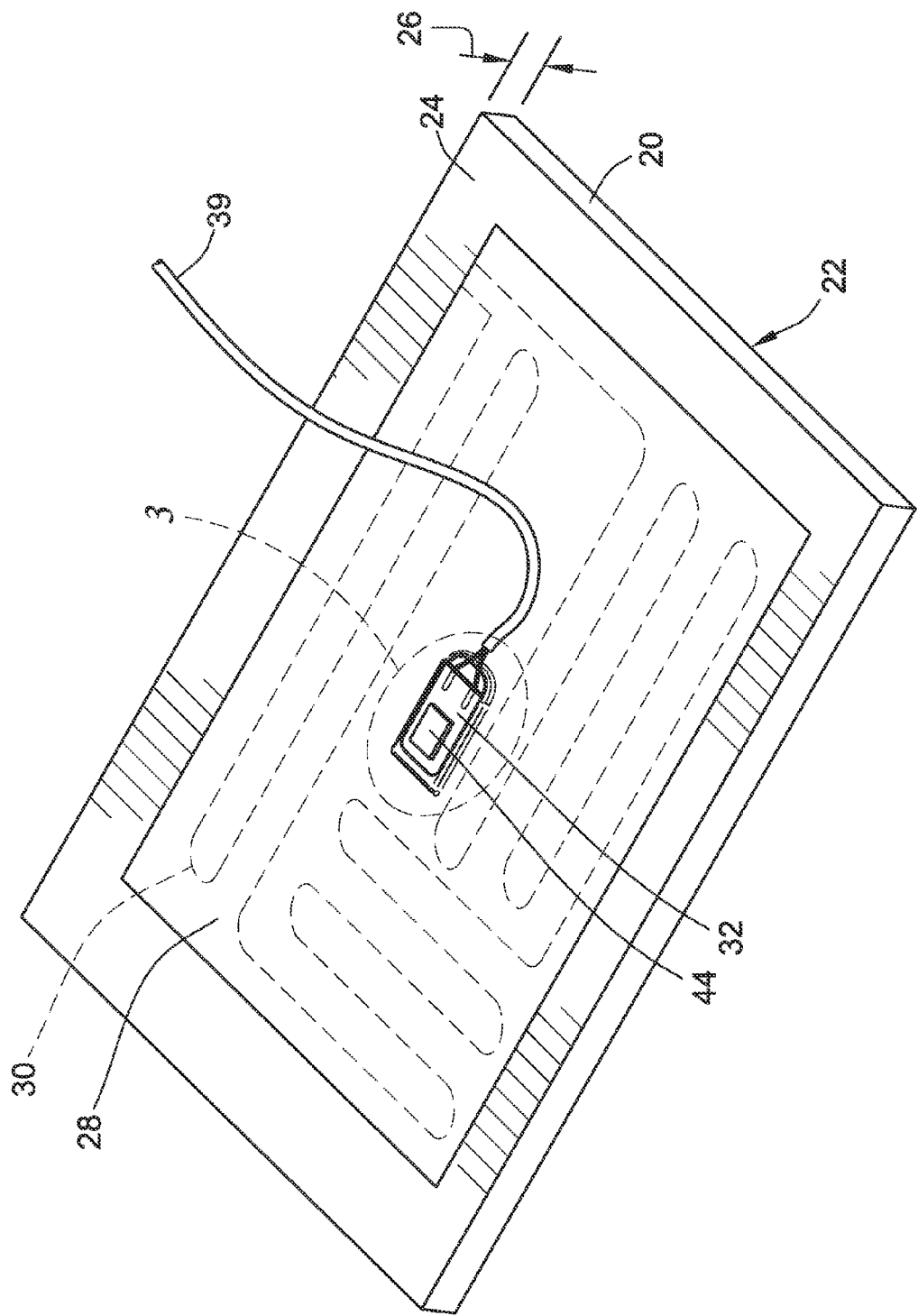
FIG. 2 is a perspective view of the bottom side of a shelf for the food holding cabinet shown in FIG. 1.

FIG. 2 is a perspective view of the bottom or underside of a thermally-conductive shelf 20. FIG. 2 also depicts one of the two-circuit board embodiments of a semiconductor temperature sensor assembly 32 described hereinafter.

The temperature sensor assembly 32 is mechanically attached to the shelf 20 and thermally-coupled to the shelf by an adhesive layer 28 that is applied to the shelf by a vulcanization process. The adhesive layer 28 holds a resistive heating wire 30 against the lower surface 24 of the shelf 20, and as explained below, the adhesive layer 28 also holds the temperature sensor assembly 32 against the shelf as well.

The adhesive layer 28 is applied by heating it to a relatively high temperature. The vulcanization temperature is so high that it can damage a semiconductor. The first three embodiments of a temperature sensor for a food holding cabinet thus use a two-circuit board structure and a two-step assembly process by which the temperature-sensing semiconductor is spared from intense heat required to vulcanize the layer 28 to the shelf 20.

Still referring to FIG. 2, the shelf 20 has a first or top surface 22, which is not visible in FIG. 2. The shelf 20 also has an opposing second or bottom surface 24, which is shown in FIG. 2. The separation distance or space between the top surface 22 and the bottom surface 24 defines the shelf thickness 26.

Both surfaces 22 and 24 are preferably planar or at least substantially planar. The top surface 22 is typically smooth enough to allow food product packages to freely slide across the top surface 22 as packages are inserted through the openings 13 on the front and back sides of the food holding cabinet 10, but also to improve heat transfer into the usually-smooth surfaces of most food packaging products.

The bottom surface 24 is also considered to be planar or substantially planar, however, the bottom surface 24 is also typically provided with stippling, knurling or other surface imperfections or roughness, not visible in the figure, which facilitate adhesion layer 28 attachment to the bottom surface 24. The adhesion layer 28 requires heat to firmly attach the material to the bottom surface 24 of the shelf 20.

Food-warming heat is provided to the shelf 20 by one or more wire loops that are mechanically attached to the bottom surface 24 and therefore thermally coupled to the shelf 20. The loops are preferably arranged in boustrophedonic or crennelate-shaped loops or windings of electrically-resistive wire 30.

Figure 3:
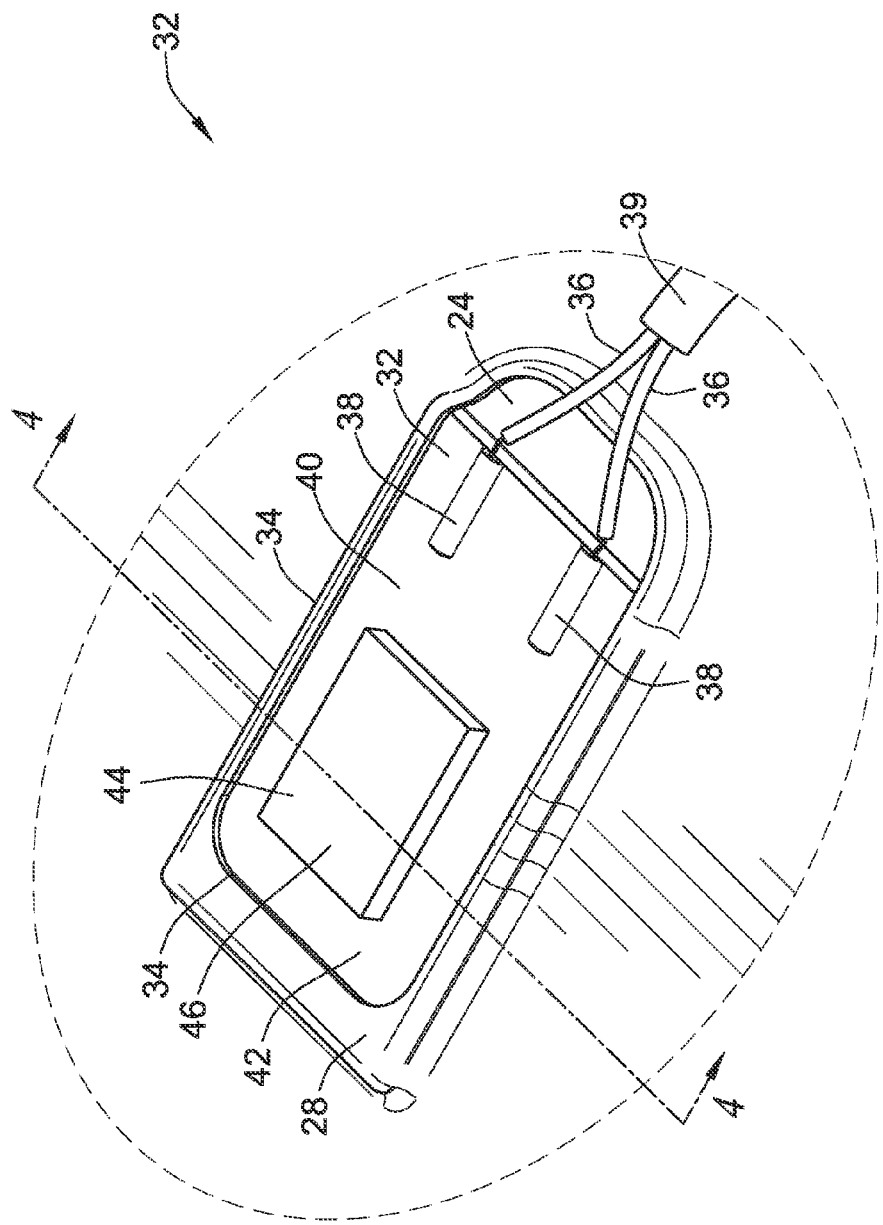
FIG. 3 is an isolated view of a temperature sensor assembly, shown in FIG. 2.

In the first three embodiments of a temperature sensor described above, the temperature sensor assembly 32 is comprised of two circuit boards 40 and 44. FIG. 2 and FIG. 3 show that a "first" circuit board 40 sits on top of the second or bottom surface 24 of the shelf 20. A "second" circuit board 44 sits atop the first circuit board 40.

The "top" side 48 of the second circuit board 44, which is not visible in FIG. 2, carries a transistor 50, which fits inside a small-diameter hole 62 formed through the first circuit board 40. When the second circuit board 44 is inverted and placed atop the first circuit board, the transistor fits within the hole and in close proximity to, or in direct contact with the surface of the shelf 20. In FIG. 3, the second circuit board 44 is shown mounted to the first circuit board 40, covering the aforementioned hole 62.

Referring now to FIG. 3, the first circuit board 40, which does not carry a semiconductor, is applied to the shelf 20 first and held in place against the shelf 20 by the adhesion layer 28. In order to hold the temperature sensor assembly 32 in place, the adhesion layer 28 is formed to extend over or cover at least part of the peripheral edge of the first circuit board 40. A hole 34 formed into the adhesion layer 28 is sized, shaped and arranged such that most of the first circuit board 40 is not covered by the adhesion layer 28. A small region near the peripheral edge of the first circuit board is overlaid with the adhesion layer 28 such that the vulcanization of the adhesion layer to the surface 24 holds the first circuit board 40 in place and up against the surface 24. The second circuit board 44 is attached to the first circuit board 40, after the vulcanization process, sparing the semiconductor temperature sensing element on the second circuit board 44 from the high temperatures required to accomplish the vulcanization process.

FIGS. 4A, 4B and 4C are cross-sections taken through section line 4-4, which is shown in FIG. 3. They show the first three semiconductor temperature sensing embodiments described above.

In FIG. 4A, the first circuit board 40 is in direct mechanical and thermal contact with the bottom surface 24 of the shelf 20 and held in place by the adhesion layer 28, which overlays a small edge portion 41 of the first circuit board 40, thereby tightly holding the first circuit board 40 against the bottom surface 24 of the shelf 20. A hole 62 extends through the first circuit board 40 and provides a "port" to the bottom surface 24 of the shelf 20.

The second circuit board 44 is mounted "upside down" on the first circuit board 40 such that the second circuit board 44 has its "top" surface 48 facing the top surface 42 of the first circuit board 40. A temperature-sensing transistor 50 is mounted to the top surface 48 of the second circuit board 44 and, when the second circuit board 44 is mounted upside down as shown, the transistor 50 fits within the hole 62 at the same time that electrical contact material 56 on the second circuit board 44 mates with and makes electrical contact with corresponding electrical contact material 54 on the top surface 42 of the first circuit board 40.

In FIG. 4A, a direct, mechanical and thermal contact exists between the transistor 50 and a pedestal 52 that extends upward from the bottom surface 24 of the shelf 20. The pedestal 52 is embodied as a slight protuberance formed into the shelf 20 or added to the bottom surface 24. In the embodiment shown in FIG. 4A, the height of the pedestal 52 is equal to or substantially equal to the thickness of the first circuit board 40 such that when the second circuit board 44 is mounted as shown to the first circuit board, at least some portion of the transistor 50 case will be in direct mechanical contact with the bottom surface 28 and therefore in direct thermal contact with the heated shelf 20. In an alternate embodiment, the thickness of the first circuit board is selected to be equal to the distance by which the transistor 50 case extends above the top surface of the second circuit board so that when the second circuit board is mounted to the first circuit board, the transistor rests on the bottom surface 24 of the shelf 20 and in direct thermal contact there with.

FIG. 4B depicts an embodiment that is substantially the same as the embodiment shown in FIG. 4A except that the transistor 50 case is separated from the bottom surface 24 by a small air gap 58. The air gap 58 is preferably small in order to enhance thermal coupling between the transistor 50 and the shelf 20.

The embodiment shown in FIG. 4C is substantially the same as the embodiment shown in FIG. 4B except that the air gap 58 that is shown in FIG. 4B is at least partially filled with a heat-conductive grease in FIG. 4C. Heat-sink grease as it is also known, transfers heat better than air.

The two-circuit board temperature sensor assembly 32 shown in FIGS. 4A-4C and the two-step assembly process used to build it, enables the second circuit board having a temperature-sensing semiconductor device to be attached to the first circuit board, and thermally-coupled to the shelf 20, after the first circuit board has been permanently attached to the bottom surface 24 of the shelf 20 and after high-temperatures used to vulcanize the adhesion layer 28 have abated. By using a separate, second circuit board that is applied after the vulcanization layer is laid down and vulcanized, the second circuit board and the accompanying transistor 50 or other semiconductor device can be spared from a high temperature vulcanization process that might otherwise destroy or damage a semiconductor, such as the transistor 50. Stated another way, by constructing the temperature sensor assembly 32 from two circuit boards instead of one, the transistor 50 can be saved from exposure to high temperatures required to fix the vulcanization layer in place. Avoiding damage to the semiconductor is important because the voltage across a PN junction is used to determine the junction's temperature, from which the shelf's temperature can be inferred.

A simple yet reliable method of measuring the temperature of the shelf 20 exploits the well-known negative temperature coefficient of a PN junction. In the embodiments disclosed herein, a bipolar transistor is connected to form a diode, i.e., a base-emitter junction. A constant current is applied to the base-emitter junction of the transistor 50, which is configured as a diode. $V_{BE}$ is measured by other circuitry in order to determine the temperature of the P-N junction. Once the junction temperature is calculated, the shelf temperature can be inferred to be virtually the same. The shelf temperature can therefore be measured using an semiconductor device that does not require calibration and which is inherently more reliable than other prior art devices used to measure temperature.

The temperature of the transistor and hence the shelf 20 is determined from the transistor $V_{BE}$ by an integrated circuit commercially available from On Semiconductor, Inc., located at 5005 East McDowell Road, in Phoenix, Ariz. 85008. The On Semiconductor ADT7461A is a dual-channel digital thermometer and under temperature/over temperature alarm device, intended for use in PCs and thermal management systems.

Electrical signals are carried between the ADT7461A and the transistor 50 within the temperature sensor assembly 32 by two wires 36 within a cable jacket 39. The wires 36 are attached to bond pads 38 on the top surface 40 of a first circuit board 42 using conventional soldering techniques.

Figure 5:
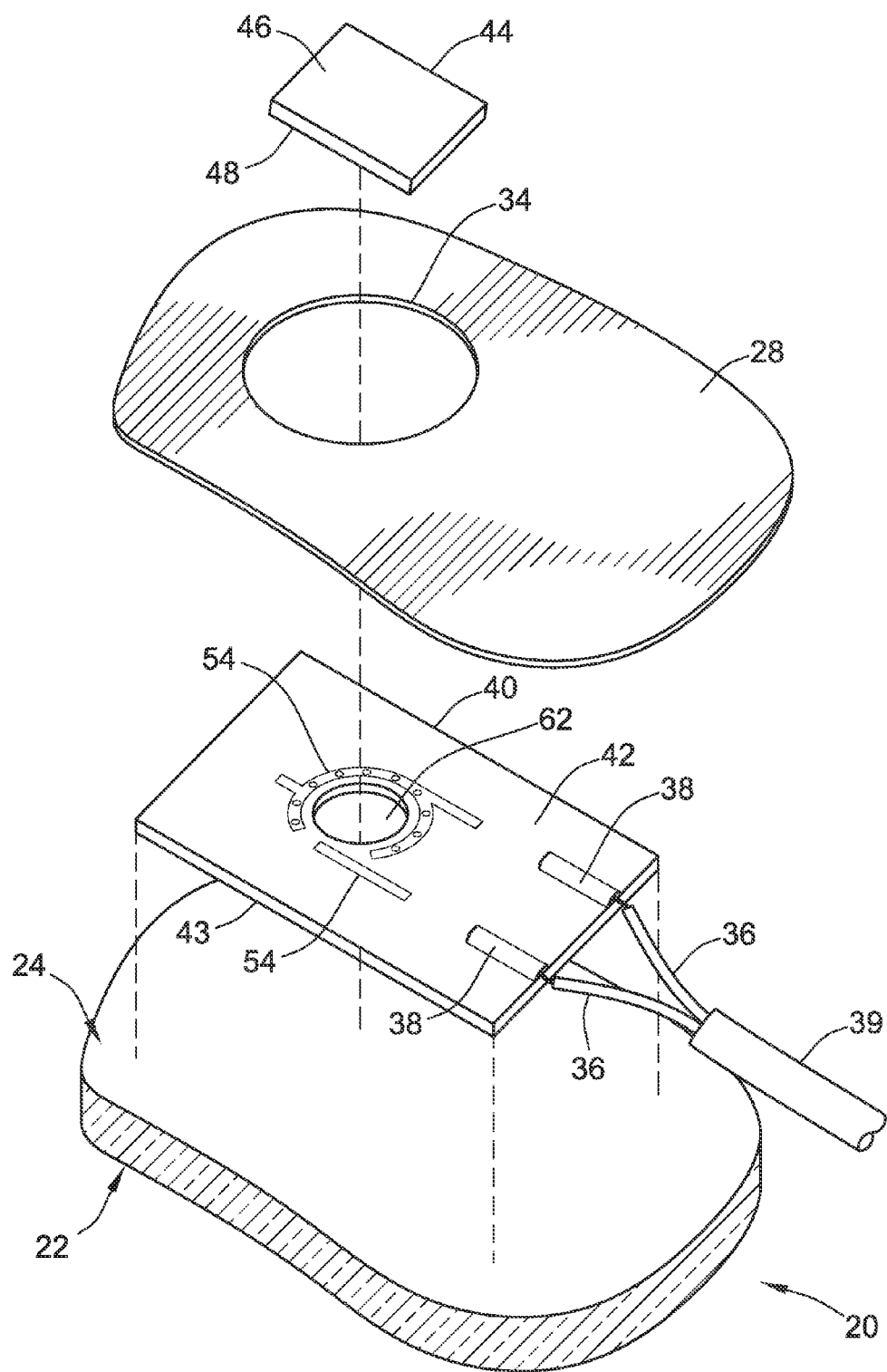
FIG. 5 is an exploded view of a semiconductor temperature sensor assembly shown in FIG. 2 and FIG. 3.

FIG. 5 is an exploded view of the structures shown in FIGS. 2-4, except that FIG. 5 does not depict the pedestal 52 shown in FIG. 4A. FIG. 5 also effectively depicts a method of attaching a semiconductor temperature sensing device to a thermally-conductive shelf, without having to subject the device 50 to excessive temperatures that might destroy it or damage it.

The first circuit board 40 is first placed on top of the bottom surface 24 of the shelf 20. As can be seen, a hole 62 extends completely through the first circuit board 40 and provides direct access to the bottom surface 24 of the shelf 20 through the first circuit board 40.

Electrical contact surfaces or "connections" 54 are applied to the circuit board 40 using conventional printed circuit board techniques, well known to those of ordinary skill. The connections 54 are electrically routed to the bond pads 38 using other well-known techniques, including the use of a multi-layer circuit board.

After the first circuit board 40 is placed atop of the bottom surface 24 of the shelf 20, the adhesion layer 28 is located so that the hole 34 aligns with the first circuit board 40 and so that the hole 34 is aligned over the hole 62 in the first circuit board 40. When the applied-to-the-bottom-surface 24 adhesion layer 28 is vulcanized, it adheres to the bottom surface 24 of the shelf 20, permanently fixing the first circuit board as well as the heating element 30. The hole 34 in the adhesion layer 28 is sized, shaped and arranged to allow attachment of the second circuit board 44 directly to the first circuit board 40. The second circuit board 44 is applied to the first circuit board 40, using conventional techniques, after the adhesion layer 28 is applied and vulcanized. The second circuit board 44, which carries the aforementioned transistor 50 on its top surface 48 is thus spared from the excessively high temperatures used to vulcanize the adhesion layer 28.

Figure 6:
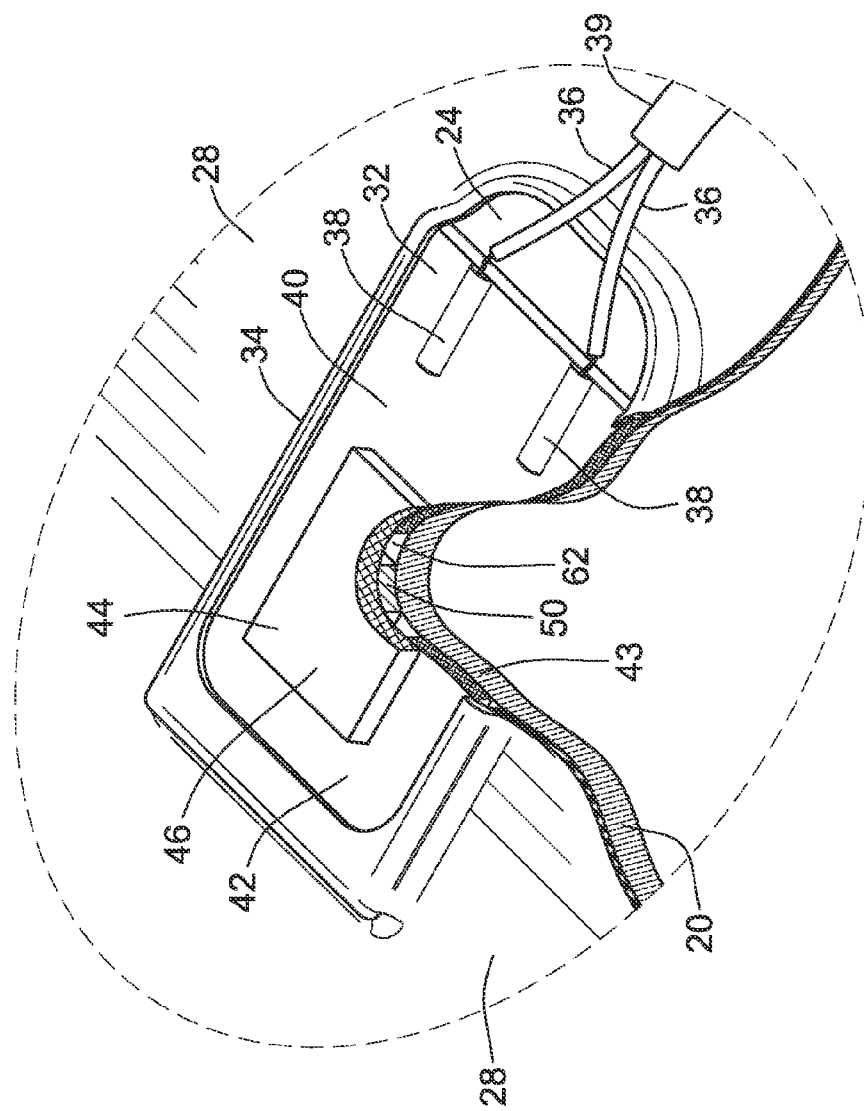
FIG. 6 is a cut-away view of the device shown in FIGS. 2-5.

FIG. 6 is a cutaway view of the temperature sensor assembly 32 shown in FIGS. 2-5, after the assembly 32 is mounted in place. The first circuit board 40 and the hole 62 included therein allow the transistor 50 to be kept in close proximity to the shelf 20 and be attached to the first circuit board 40 after the vulcanization process has taken place.

FIG. 7 shows the tops of the first and second circuit boards 40 and 44 respectively. Electrical contacts 56 on the top side 48 of the second circuit board 44 align with mating electrical connections 54 on the top surface 42 of the first circuit board 40 provide signal pathways to and from the transistor 50. When the second circuit board 44 is inverted and placed atop the first circuit board 40, the electrical connections on the two circuit boards "face" and connect to each other.

Those of ordinary skill in the electronic and mechanical arts know that plastic is not a particularly good conductor of thermal energy nor is the plastic packaging commonly used to enclose discrete transistors. While the structures depicted in FIGS. 4A-7 provide good thermal coupling between a temperature-sensing transistor and a plate, a preferred way of thermally coupling a PN junction within a plastic package is to use one of the electrically and thermally-conductive metallic leads that extend from the plastic package. In the case of the MMBT3906 SOT-23 transistor, the collector of the transistor is attached to the substrate of the die on which the temperature-sensing transistor is fabricated. The collector pin on the SOT23 package for the transistor is therefore connected to a via or hole through the board (or a plurality of vias) so that heat can be conducted through the via to the collector lead and directly to the die.

Figure 8:
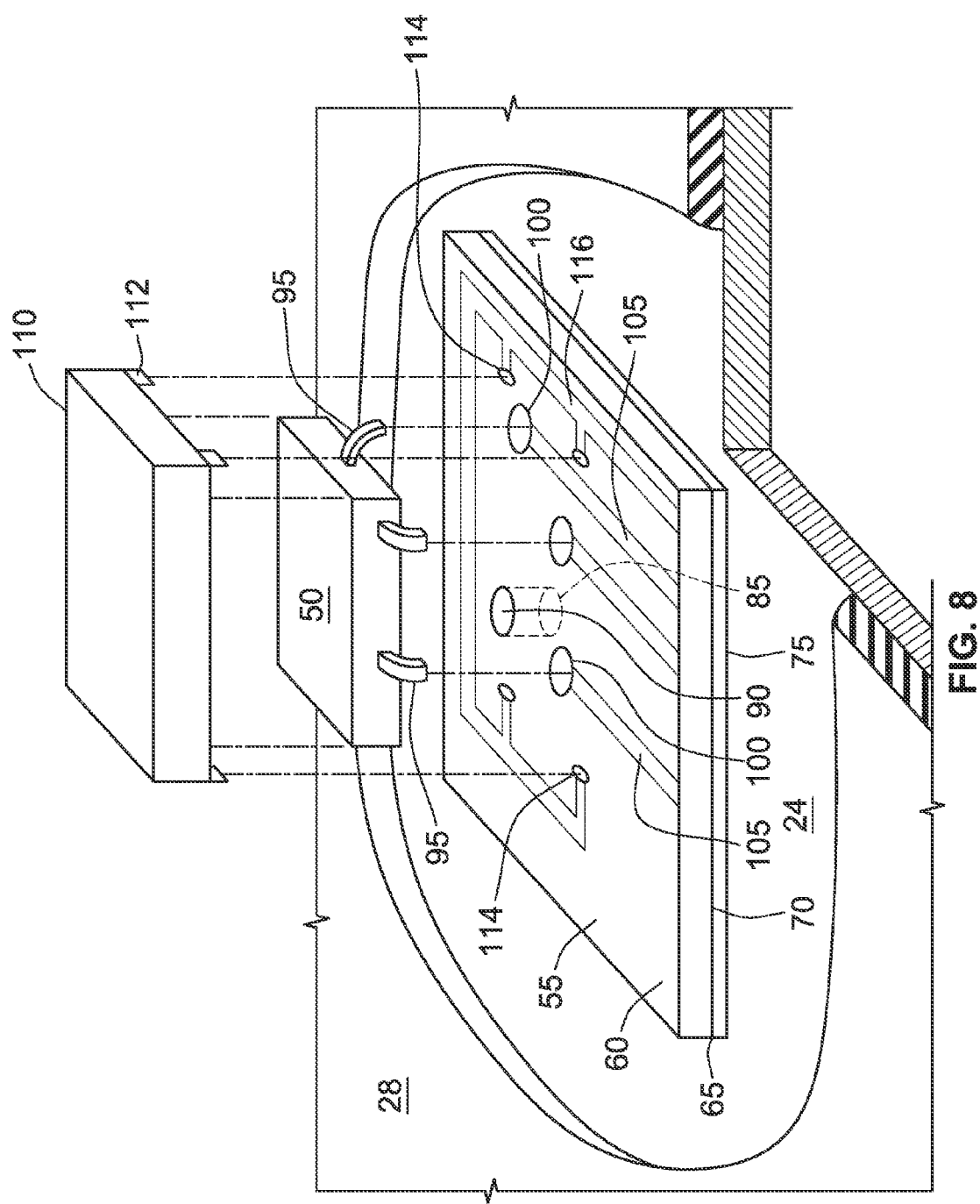
FIG. 8 is a perspective view of a preferred embodiment of a semiconductor temperature sensor.
Figure 9:
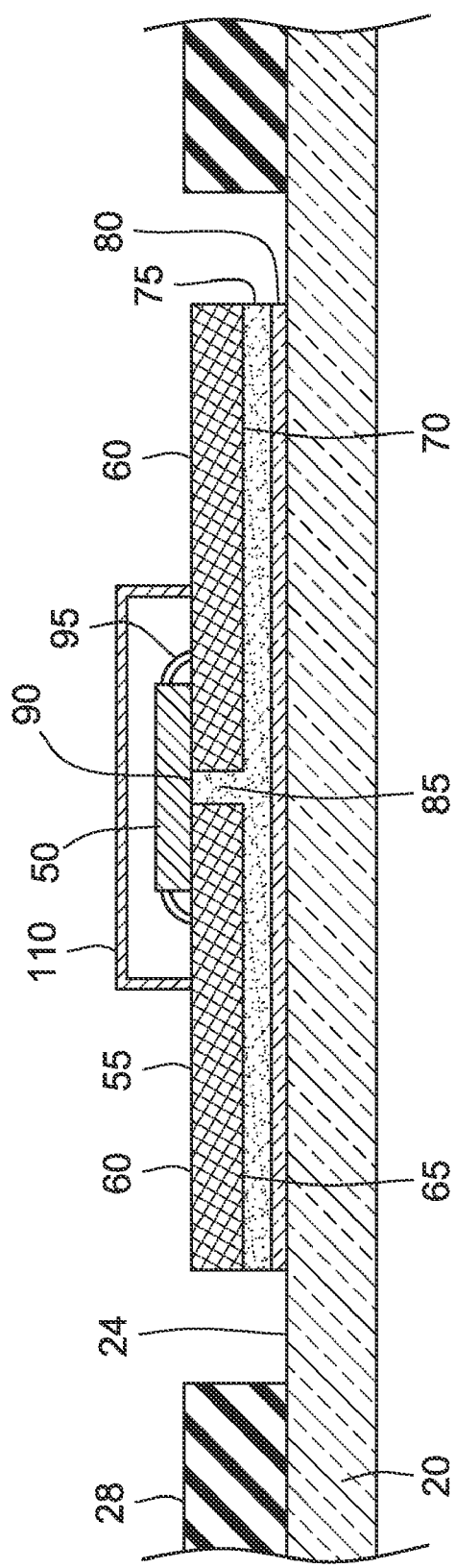
FIG. 9 is a cross sectional view of the structure shown in FIG. 8.

FIG. 8 is an exploded view of a preferred embodiment of a semiconductor temperature sensor assembly 50. FIG. 9 is a cross sectional view of the device shown in FIG. 8.

Unlike the embodiments depicted in FIGS. 2-7, which are comprised of two circuit boards, the temperature sensor assembly 50 shown in FIG. 8 is comprised of a single circuit board 55 and a temperature-sensing transistor 50. In the preferred embodiment, the circuit board 55 is relatively small, measuring about one inch on a side. While it is preferred to make the circuit board 55 as thin as possible to improve heat transfer into the transistor, the shape of the circuit board 55 is a design choice.

In FIGS. 8 and 9, the top side of the circuit board is identified by reference numeral 60. Only the edge of the bottom side 70 is visible in both FIG. 9 and it is identified by reference numeral 70.

As depicted in FIG. 9, the bottom side 70 of the circuit board 60 is clad with a layer of copper 75 or other good conductor of heat. The copper layer 75 is tinned to reduce oxidation.

A heat-conducting, double-sided adhesive tape 80 such as 3M™ Thermally Conductive Adhesive Transfer Tapes, 8805, 8810, 8815 or 8820, is applied to the copper layer 75. The heat-conducting tape 80 holds the circuit board 55 against the bottom surface 24 of the shelf 20. Using the tape 80, the circuit board 55 can be applied at any time after manufacture of the shelf 20. The tape 80 also allows a circuit board 55 and the components it carries to be easily removed and replaced.

At least one through-hole or via 85 is formed in the circuit board 55 prior to its attachment to the shelf 20. The via 85 extends through the top side 60 to the copper layer 75. The via 85 is preferably filled with thermally-conductive material, such as tin or other metal and makes a direct physical contact with the copper cladding layer 75 on the bottom side 70, however, alternate embodiments include a via that is hollow. The collector lead of the transistor can be coupled to one of the vias 85 that extend through the circuit board 55 and down to the copper layer to expedite heat transfer into the transistor die.

Heat energy from the shelf 20 is conducted through the tape 80, through the copper layer 75 and into the via 85. Since the via is made of a thermally-conductive material, heat from the shelf 20 is conducted to the top end 90 of the via 85, which is preferably located directly under the temperature-sensing transistor 50 so that heat from the via is carried into the transistor 50 by one or more of convection, conduction or radiation, depending on the space, if any, between the transistor and the top 90 of the via 85.

The top end 90 of the via 85 is preferably co-planar or "substantially" co-planar with the top side 60 of the circuit board 55 to allow the transistor 50 to sit "flush" with the top side 60 of the circuit board 55 and in direct contact with the top end 90 of the via 85. Having the top end 90 of the via 85 flush also enables the transistor 50 to be affixed using well-known surface mounting techniques.

Figure 10:
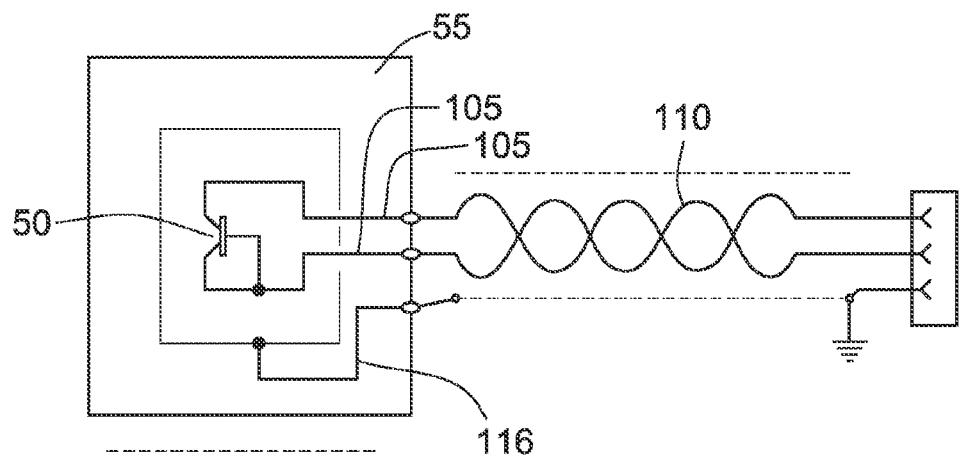
FIG. 10 is an electrical schematic of a semiconductor temperature sensor.

Electrical leads 95 for the transistor 55 shown in the figures extend downwardly from the transistor case to bond pads 100 on the top side 60 of the circuit board 55. Conventional conductive paths 105 on the top side 60 extend away from the bond pads 100 and provide connection points for wires in a cable 110. As shown in FIG. 10, the cable 110 and its included wires connect the transistor 50 to an integrated circuit or microprocessor, not shown but well known to those of ordinary skill. The IC or other processor measures voltage across a PN junction within the transistor 50 from which the junction temperature can be determined and from which the shelf temperature can be inferred.

An optional radio frequency (RF) shield 110 covers the transistor 50 and is electrically grounded through at least one ground lug 112 that mates with a hole 114 in the top side 60. A conductive trace 116 provides a ground connection to the cable 110 or surface mount pad, which provides a connection to ground or some other reference potential.

FIG. 10 is an electrical schematic diagram of the temperature sensor assemblies shown in the figures. In this figure, the transistor is assumed to be an NPN-type transistor. The base is short-circuited to the emitter to provide the aforementioned temperature-sensing P-N junction.

Two wires 110, which are connected to a lead frame or a printed circuit trace 105 on the circuit board, connect the transistor to other circuitry that provides a numeric representation of the junction temperature. A ground trace 116 on the circuit board provides connection points for an RF shield 110. The ground trace 116 on the circuit board can be electrically connected to a reference potential.

Figure 11:
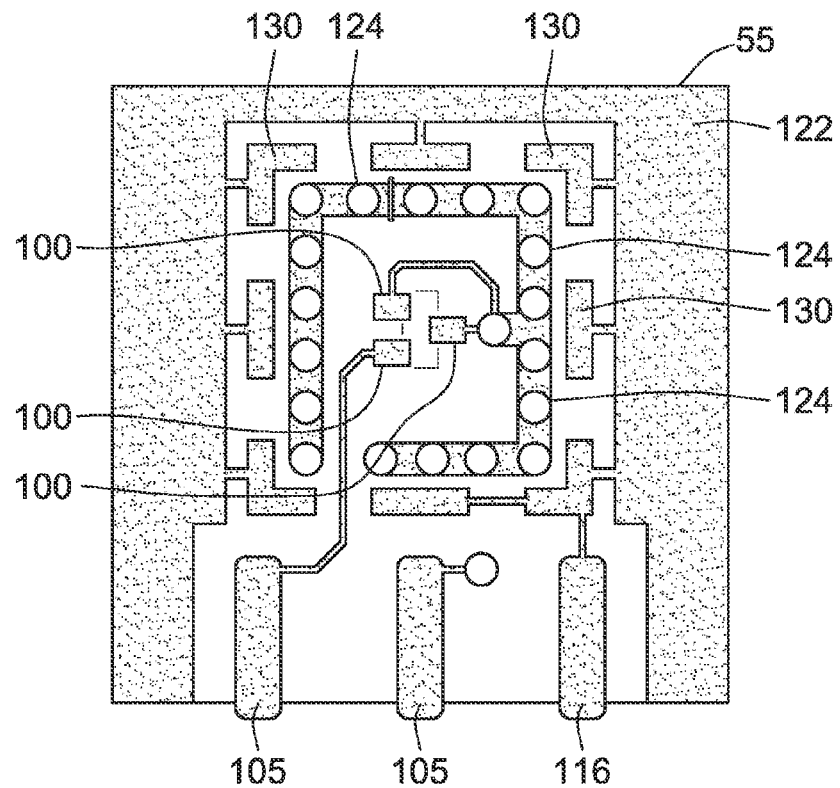
FIG. 11 is a plan view of the art work for a circuit board used in an alternate embodiment of a temperature sensor.
Figure 12:
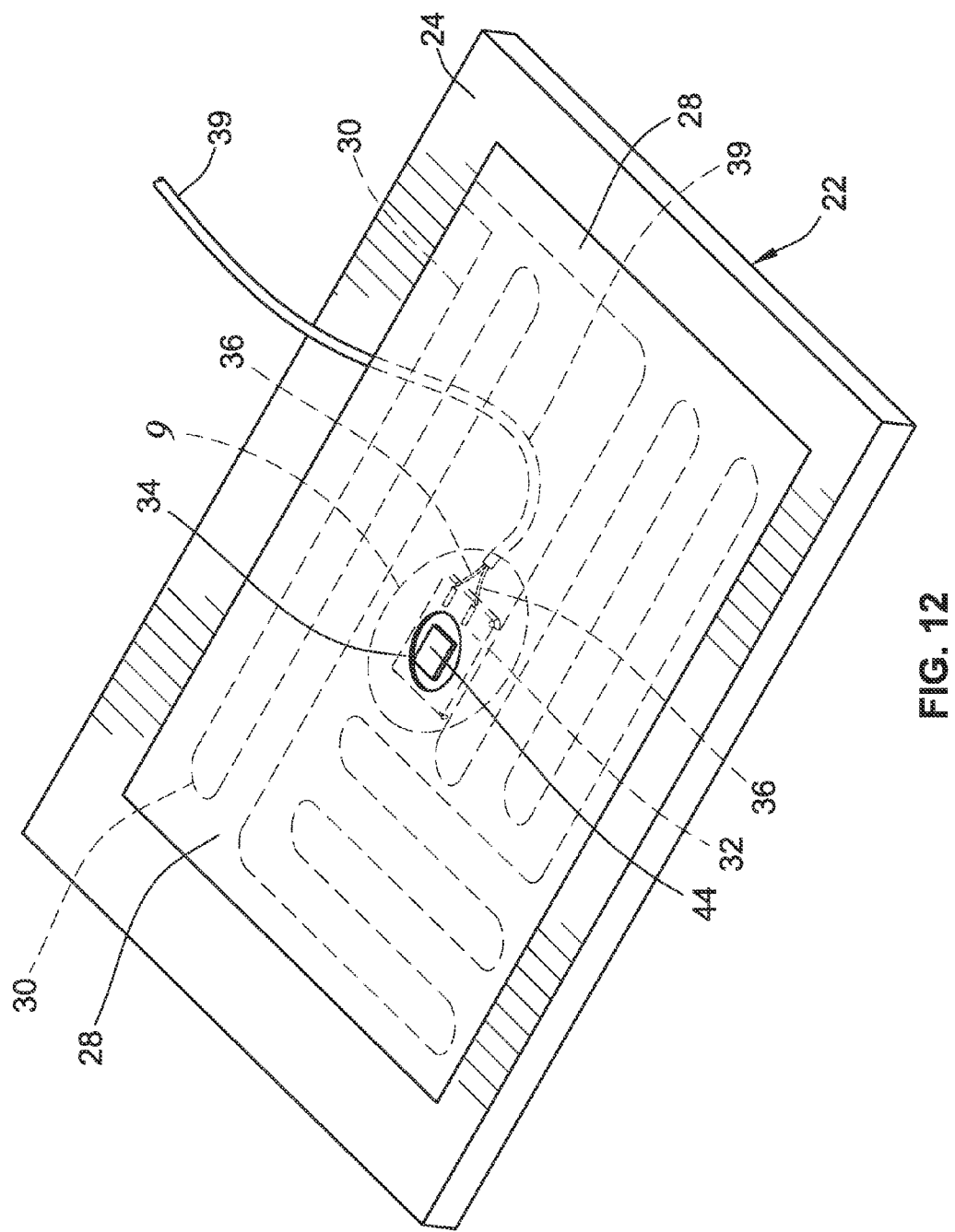
FIG. 12 depicts the shelf shown in FIG. 2 but wherein a signal cable and its included wires are covered by an adhesive layer 28.

FIG. 11 is a plan view of an alternate embodiment of the circuit board 55, which does not have a conductive via directly below where the transistor 50 is mounted. Several thermally-conductive vias 124 extend through the circuit board 55 to the aforementioned copper layer. The thermally-conductive vias 124 "surround" the bond pads 100 to which a temperature-sensing transistor 50 is mounted and provide a heat transfer pathway. The aforementioned RF shield is attached to pads 130, electrically connected to a ground plane 122 near the edge, which is electrically grounded through the aforementioned cable and helps isolate the PN junction from electric noise.

In a preferred embodiment, the transistor 50 is embodied as an MMBT3906 PNP transistor. Those of ordinary skill in the electronic art will recognize that NPN transistors also have P-N junctions. For purposes of claim construction, any recitation of a P-N junction should be construed to include both PNP and NPN transistors.

While transistors are preferred, diodes can also be used to provide a PN junction. The term PN junction should therefore be construed to include a diode as well.

A temperature-measuring processor includes the aforementioned ADT7461 integrated circuit (IC). Other temperature-measuring processors and ICs include the ADM1032 and ADT7481 devices, which are also available from On Semiconductor. Texas Instruments, Inc. part numbers TMP421, TMP422 and TMP423 are also believed to be usable for temperature measurement of the transistor 50. A general purpose microcontroller with on-board analog to digital conversion circuitry can also be used to measure $V_{BE}$ and hence provide an output signal (binary) representative of the junction temperature and hence the shelf temperature.

The shelf is preferably made of aluminum sheet, approximately one-quarter of an inch thick. The heating element 30 wire has its exterior surface coated with an electrically insulating layer to prevent the current flowing through the wire from being conducted into the aluminum plate.

While the foregoing description pertains to a heated shelf, a cooling shelf can be implemented using one or more Peltier devices the cold sides of which are thermally coupled to the shelf. Cold shelves can also be realized using a conventional vapor phase/liquid phase refrigeration system with the evaporator-side cooling coils affixed to the shelf, similar to how the heating wire 30 is attached as well as a refrigerated liquid that is circulated through a heat exchanging device thermally coupled to the shelf.

The aforementioned heating wire 30, a Peltier device, a liquid-phase/vapor phase refrigeration system and a circulating refrigerated liquid are all different embodiments of a heat transfer device in the sense that each of them exchanges or transfers heat with the thermally-conductive surface 24 of a thermally-conductive shelf 20. A heat-sinking device such as a Peltier device absorbs heat energy from the shelf 20 whereas a heated wire 30 emits heat energy into the shelf 20.

Those of ordinary skill in the art should recognize that the foregoing description is for purposes of illustration only and not for purposes of limitation. The true scope of the invention is set forth in the appurtenant claims.

What is claimed is:

1. A temperature sensor for a food holding cabinet, the sensor comprised of:
   a first circuit board having a thickness, top and bottom surfaces and a hole that extends through the top and bottom surfaces;
   a second circuit board having top and bottom surfaces and having a transistor mounted to the top surface thereof, the second circuit board being mounted to the first circuit board such that, at least part of the transistor is within the hole, between the top and bottom surfaces of the first circuit board.

2. The temperature sensor of claim 1, further including a heat-conductive grease within the hole.

3. The temperature sensor of claim 1, wherein the transistor is in physical contact with the second side of a heated shelf when said transistor is within said hole.

4. The temperature sensor of claim 1, further comprised of:
   first and second electrical connections on the top surface of the first circuit board;
   first and second electrical connections on the top surface of the second circuit board, the first and second electrical connections on the top surface of the second circuit board mating with first and second electrical connections on the top surface of the first circuit board.

5. A temperature-controlled food holding cabinet comprised of:
   a thermally-conductive shelf for supporting foods to be kept warm, the shelf having first and second sides;
   a heating element thermally coupled to the thermally-conductive shelf (shelf);
   a temperature sensor thermally coupled to at least the second surface of the conductive shelf, the temperature sensor measuring temperature and providing an output signal equivalent thereto;
   an adhesion layer on the second surface of the thermally conductive shelf;
   a first circuit board having top and bottom surfaces and a hole that extends through the first circuit board, the first circuit board being attached to the second side of the thermally conductive shelf by the adhesion layer such that the bottom surface of the first circuit board faces the second side of the thermally conductive shelf; and
   a second circuit board mounted to the first circuit board, the second circuit board having top and bottom surfaces and having the transistor temperature sensor mounted to the top surface thereof, the second circuit board being mounted to the first circuit board such that, at least part of the transistor is within the hole and such that the top surface of the second circuit board faces the top surface of the first circuit board.

6. The food holding cabinet of claim 5, wherein said hole is at least partially filled with heat-conductive grease and wherein the transistor is at least partially embedded within said heat-conductive grease.

7. The food holding cabinet of claim 5 wherein the transistor is in physical contact with the second side of the shelf when said transistor is within said hole.

8. The food holding cabinet of claim 5, further comprised of:
   first and second electrical connections on the top surface of the first circuit board;
   first and second electrical connections on the top surface of the second circuit board, the first and second electrical connections on the top surface of the second circuit board mating with first and second electrical connections on the top surface of the first circuit board.

* * * * *